US008610860B2

(12) United States Patent
Huang et al.

(10) Patent No.: US 8,610,860 B2
(45) Date of Patent: Dec. 17, 2013

(54) ARRAY SUBSTRATE AND MANUFACTURING METHOD THEREOF, AND LIQUID CRYSTAL DISPLAY

(75) Inventors: Weiyun Huang, Beijing (CN); Young Yik Ko, Beijing (CN); Minghua Xuan, Beijing (CN)

(73) Assignees: Boe Technology Group Co., Ltd., Beijing (CN); Chengdu Boe Optoelectronics Technology Co., Ltd., Chengdu (CN)

( * ) Notice: Subject to any disclaimer, the term of this patent is extended or adjusted under 35 U.S.C. 154(b) by 175 days.

(21) Appl. No.: 13/234,394

(22) Filed: Sep. 16, 2011

(65) Prior Publication Data

US 2012/0069286 A1    Mar. 22, 2012

(30) Foreign Application Priority Data

Sep. 17, 2010  (CN) .......................... 2010 1 0286926

(51) Int. Cl.
*G02F 1/1343*    (2006.01)
(52) U.S. Cl.
USPC .......................................................... 349/141
(58) Field of Classification Search
USPC .......................................................... 349/141
See application file for complete search history.

(56) References Cited

U.S. PATENT DOCUMENTS

| 2003/0184693 | A1 | 10/2003 | Kadotani et al. |
| 2005/0110931 | A1 | 5/2005 | Yoo et al. |
| 2006/0290863 | A1 | 12/2006 | HoeSup |
| 2007/0146605 | A1 | 6/2007 | Park et al. |
| 2008/0284965 | A1 | 11/2008 | Ryu et al. |
| 2008/0284967 | A1 | 11/2008 | Oh et al. |
| 2009/0207365 | A1 | 8/2009 | Lee et al. |
| 2010/0296040 | A1* | 11/2010 | Han et al. ...................... 349/139 |
| 2011/0109861 | A1* | 5/2011 | Son et al. ....................... 349/141 |

FOREIGN PATENT DOCUMENTS

| CN | 1448770 | A | 10/2003 |
| CN | 1614742 | A | 5/2005 |
| CN | 1226663 | C | 11/2005 |
| CN | 1885140 | A | 12/2006 |
| CN | 101308294 | A | 11/2008 |
| CN | 101308299 | A | 11/2008 |
| CN | 100476529 | C | 8/2009 |
| CN | 101515097 | A | 8/2009 |

* cited by examiner

*Primary Examiner* — Timothy L Rude
(74) *Attorney, Agent, or Firm* — Ladas & Parry LLP

(57) ABSTRACT

The disclosed technology relates to an array substrate and a method of manufacturing the same, and a liquid crystal display. The array substrate comprises a base substrate. The base substrate comprises a pixel region and a peripheral region; data lines and gate lines are formed to transversely and longitudinally cross each other on the base substrate to form a plurality of pixel units, and each of the pixel units comprises a switching element, a pixel electrode and a common electrode above the pixel electrode; the common electrode has slits in each pixel unit and is a plate-shaped electrode in the pixel region, when powered on, the common electrode forms a horizontal electric field together with the pixel electrode of the pixel unit; and a common electrode line formed in the pixel region and connected with the common electrode.

4 Claims, 16 Drawing Sheets

ARRAY SUBSTRATE AND MANUFACTURING METHOD THEREOF, AND LIQUID CRYSTAL DISPLAY

BACKGROUND

Embodiments of disclosed technology relate to an array substrate and a method of manufacturing an array substrate, and a liquid crystal display.

Presently, liquid crystal displays (LCDs) are flat panel displays which are commonly used; thin film transistor liquid crystal displays (TFT-LCDs) are the main kind of liquid crystal displays. TFT-LCDs have been dominating the market of mediate and small sized displays, due to low cost, high yield and excellent display effect.

Fringe-field switching (FFS) technology can improve the picture quality of TFT-LCDs, and has advantages of wide viewing angle, high aperture ratio, short response time, no push Mura, and so on. However, the manufacturing process of a FFS mode LCD, electrical field formation and switching mode of liquid crystal and so on give rise to serious signal delay of common voltage ($V_{com}$), and crosstalk occurs. Crosstalk is an important factor affecting picture quality, and may represent the degree of influence from a gray-scale picture in one region to an adjacent pixel region. The industry standard generally requires crosstalk of less than 2%.

In the liquid crystal displaying technology, capacitance formed between a common electrode and a pixel electrode is an important factor for the common electrode to generate signal delay, and the amount of the capacitance can refer to the calculating formula: $C=\epsilon_r\epsilon_0 *S/d$, where C is capacitance; $\epsilon_r$ is relative dielectric constant, which is related to material property; $\epsilon_0$ is absolute dielectric constant; S is the area of the electrodes; and d is the distance between the electrodes.

FIG. 1 is a diagram of capacitance formed between a common electrode and a pixel electrode in FFS mode LCD, and FIG. 2 is a diagram of capacitance formed between a common electrode and a pixel electrode in TN mode LCD.

As shown in FIG. 1 and FIG. 2, the common electrode 13 is applied with a common voltage ($V_{com}$) signal, and the pixel electrode 11 is applied with a pixel voltage ($V_{pixel}$) signal, and capacitance is formed between the common electrode 13 and the pixel electrode 11. In the FFS mode LCD, the common electrode 13 and the pixel electrode 11 are both located on an array substrate 50, and the capacitance dielectric material between the common electrode 13 and the pixel electrode 11 is a passivation layer (PVX), of which $\epsilon_r$ is about 5 and d is about 0.5 μm. As shown in FIG. 2, in the TN mode LCD, the common electrode 13 is located on a color film substrate 60, and the pixel electrode 11 is located on an array substrate 50, and the capacitance dielectric material between the common electrode 13 and the pixel electrode 11 is liquid crystal (LC), of which $\epsilon_r$ is about between and 12 and d is about 5 μm. Referring to the above formula, it can be estimated that the $C_{com}$ in the FFS mode is about ten times of that in the TN mode, and the capacitance formed between the common electrode and the pixel electrode in the FFS mode is increased by one order than that in the TN mode. Thus, compared with TN mode LCD, the loading ability of the common voltage of the FFS mode is relatively low, and crosstalk more easily occurs.

High aperture ratio FFS (HFFS) LCDs are one kind of FFS LCDs, which are mainly used for TFT-LCDs of mediate and small size. The typical structure of HFFS type array substrate comprises a base substrate, data lines and gate lines are formed to transversely and longitudinally cross to form a plurality of pixel units on the base substrate, and each of the pixel units may comprise a switching element, a pixel electrode and a common electrode having slits. The pixel electrodes arranged in a matrix are disposed to opposite to the common electrode of a whole piece, and the common electrode has slits in the each pixel unit. The region constituted by the pixel units is referred to a pixel region, and the region outside of the pixel region is referred to an interface region.

FIG. 3 is a diagram of the formation of electric field and rotation of liquid crystal in a conventional HFFS LCD. As shown in FIG. 3, the common electrode 13 and the pixel electrode 11 are both located on an array substrate, and they can both be formed of indium tin oxides (ITO). The common electrode 13 with slits and the underlying pixel electrode 11 together form a horizontal electric field 70 when applied a voltage therebetween. The electric field 70 can rotate the liquid crystal molecules, which are horizontally arranged between the array substrate 50 and the color film substrate 60, to function as a light valve. FIG. 4 is a diagram of hierarchy structure of a conventional HFFS LCD. As shown in FIG. 4, the sequence of deposition and etching of an HFFS LCD manufactured by using six-photolithography method may include: a gate line and the gate electrode (Gate), a gate insulation layer (GI), an active layer (Active), a pixel electrode (a first ITO layer), source/drain electrodes (SD), a passivation layer (PVX) and a common electrode (a second ITO layer); and the sequence of deposition and etching of an HFFS LCD manufactured by using five-photolithography method may include: a gate line and the gate electrode, the gate insulation layer, an active layer, source/drain electrodes, a pixel electrode, a passivation layer, and a common electrode.

The common electrode in an HFFS LCD has slits and thus has a larger resistance than a complete piece of plate common electrode flat, so RC signal delay of the common electrode is much larger, which causes the loading ability of the common voltage signal to decrease, thereby the crosstalk phenomena is more apparent and the picture quality is affected disadvantageously.

SUMMARY

According to an embodiment of the disclosed technology, an array substrate is provided. The array substrate comprises: a base substrate, comprising a pixel region and a peripheral region; data lines and gate lines formed to transversely and longitudinally cross each other on the base substrate to form a plurality of pixel units in the pixel region, wherein each of the pixel units comprises a switching element, a pixel electrode and a common electrode above the pixel electrode, and the common electrode has slits in each pixel unit and is a plate-shaped electrode in the pixel region, and when powered on, the common electrode forms a horizontal electric field together with the pixel electrode of the pixel unit; and a common electrode line formed in the pixel region and connected with the common electrode.

According to another embodiment of the disclosed technology, a method of manufacturing an array substrate is provided. The method comprises: forming gate lines, switching elements, data lines, a common electrode line, pixel electrodes, and a common electrode above the pixel electrodes in a pixel region of a base substrate, wherein the data lines and the gate lines transversely and longitudinally cross each other to form a plurality of pixel units, the common electrode has slits in each pixel unit and is a plate-shaped electrode in the pixel region, and the common electrode line is formed in the pixel region and connected with the common electrode.

According to another embodiment of the disclosed technology, a liquid crystal display is provided. The liquid crystal display comprises a liquid crystal panel, wherein the liquid crystal panel comprises a color film substrate and the array substrate described above facing with each other, and a liquid crystal layer is interposed between the color film substrate and the array substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF DRAWINGS

The present invention will become more fully understood from the detailed description given hereinafter and the accompanying drawings which are given by way of illustration only, and thus are not limitative of the present invention and wherein.

DETAILED DESCRIPTION

The embodiments of the disclosed technology will be described clearly and completely in combination with the figures of the embodiments of the disclosed technology, so as to make the aims, technical solutions and advantages of the embodiments of the disclosed technology to be clearer.

First Embodiment

Figure 1:
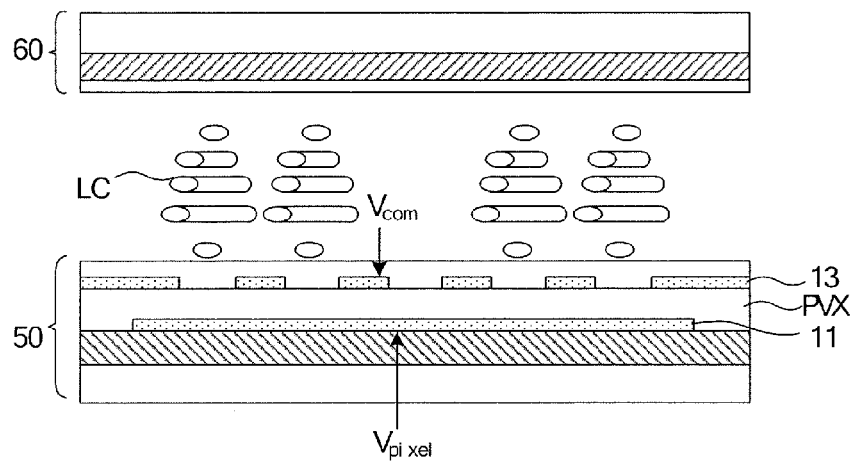
FIG. 1 is a diagram of capacitance formed between a common electrode and a pixel electrode in FFS mode.
Figure 2:
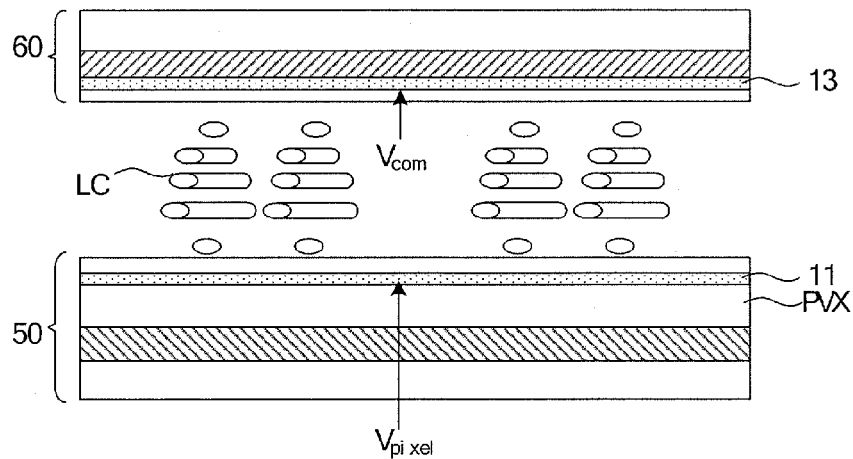
FIG. 2 is a diagram of capacitance formed between a common electrode and a pixel electrode in TN mode.
Figure 3:
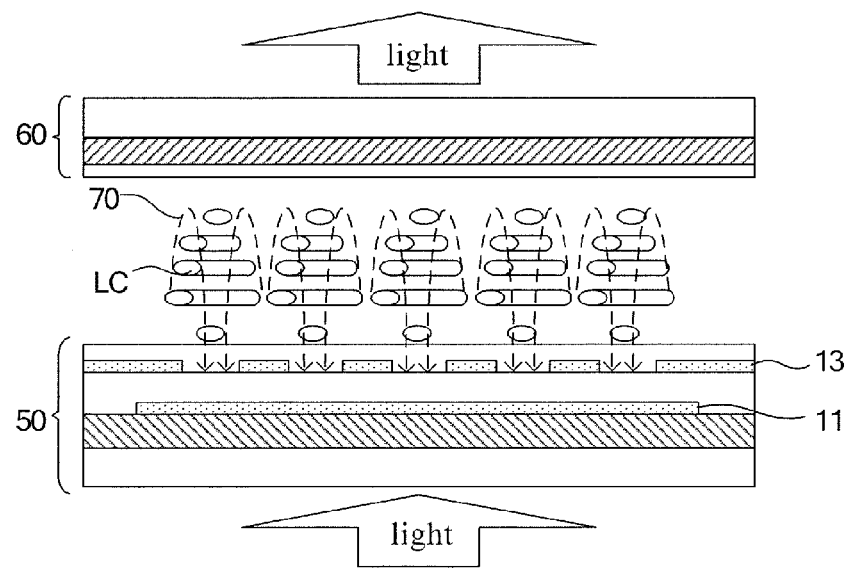
FIG. 3 is a diagram of formation of electric field and rotation of liquid crystal in a conventional HFFS LCD.
Figure 4:
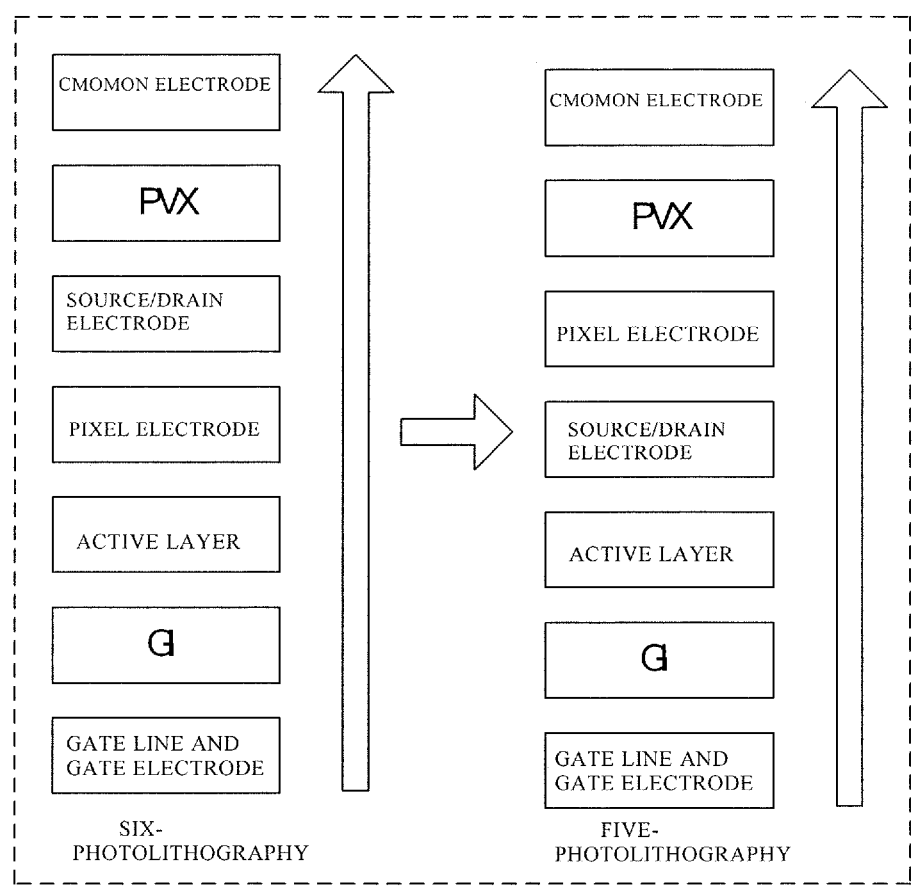
FIG. 4 is a diagram of the hierarchy structure of a conventional HFFS LCD.
Figure 5:
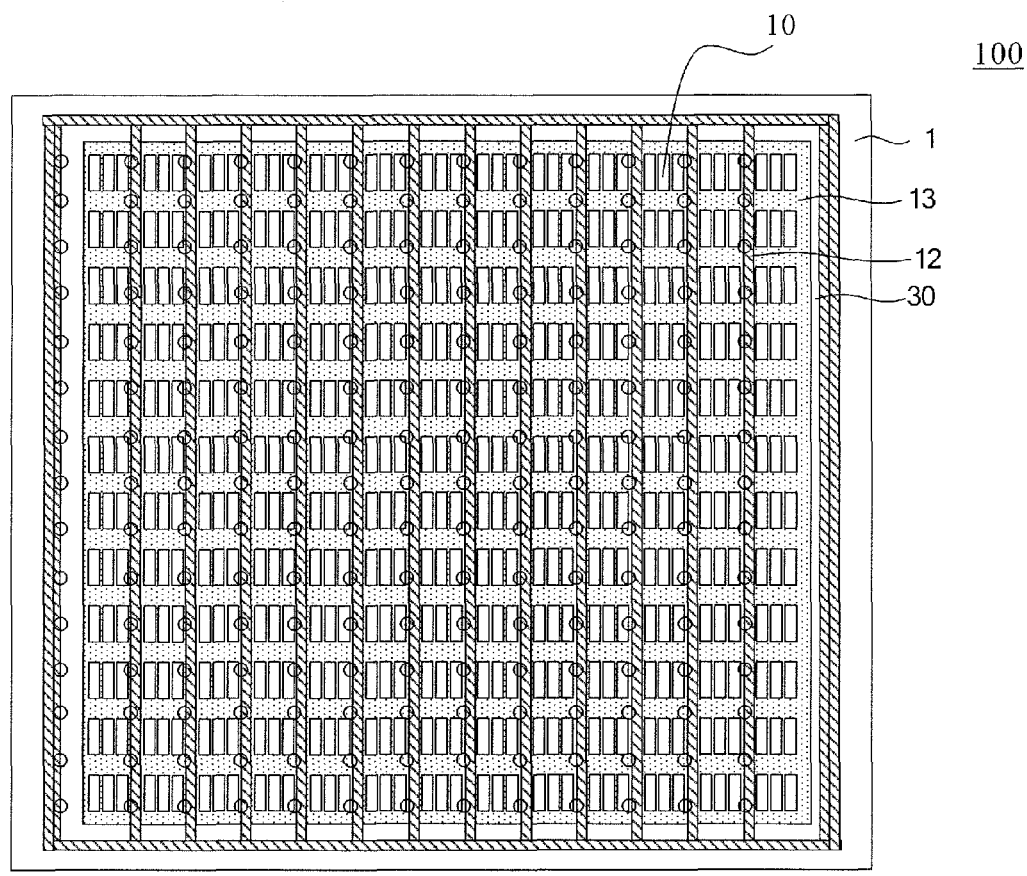
FIG. 5 is a structural diagram of a array substrate provided by a first embodiment of the disclosed technology.

FIG. 5 is a structural view of an array substrate provided by a first embodiment of the disclosed technology. As shown in FIG. 5, the array substrate 100 comprises a base substrate 1, and data lines and gate lines are formed to transversely and longitudinally cross each other in a pixel region 30 of the base substrate to form a plurality of pixel units 10. Each pixel unit 10 comprises a switching element, a pixel electrode and a common electrode 13, and the common electrode 13 has slits in the pixel unit and is plate-shaped electrode of a whole piece pattern arranged in the entire pixel region 30. At least one common electrode line 12 is further formed in the pixel region 30, and the common electrode line 12 is connected with the common electrode 13.

In the array substrate of the liquid crystal display of an HFFS mode LCD, the common electrode line 12 may be formed in the pixel region 30. The common electrode line 12 and the common electrode 13 may be connected through contact via holes, and may also be directly overlap-connected with each other. Since the common electrode 13 is of a whole piece pattern which has slits and is arranged in the entire pixel region, after the common electrode line 12 and the common electrode 13 is connected, the resistances of the common electrode line 12 and the common electrode 13 can be electrically connected in parallel, which can reduce the whole resistance of the common electrode 13.

In the present embodiment, the common electrode line is formed in the pixel region of the array substrate of the liquid crystal display, and the common electrode line and the common electrode are connected with each other, so the resistance of the common electrode can be reduced, thereby reducing the RC signal delay of the common electrode, and improving the loading ability of the common voltage ($V_{com}$) signal. Therefore, the crosstalk phenomenon can be alleviated and the picture quality of the liquid crystal display can be improved.

Further, the position of the common electrode line formed in the pixel region 30 may include the following several manners. Detailed description will be given below.

Example 1

Figure 6A:
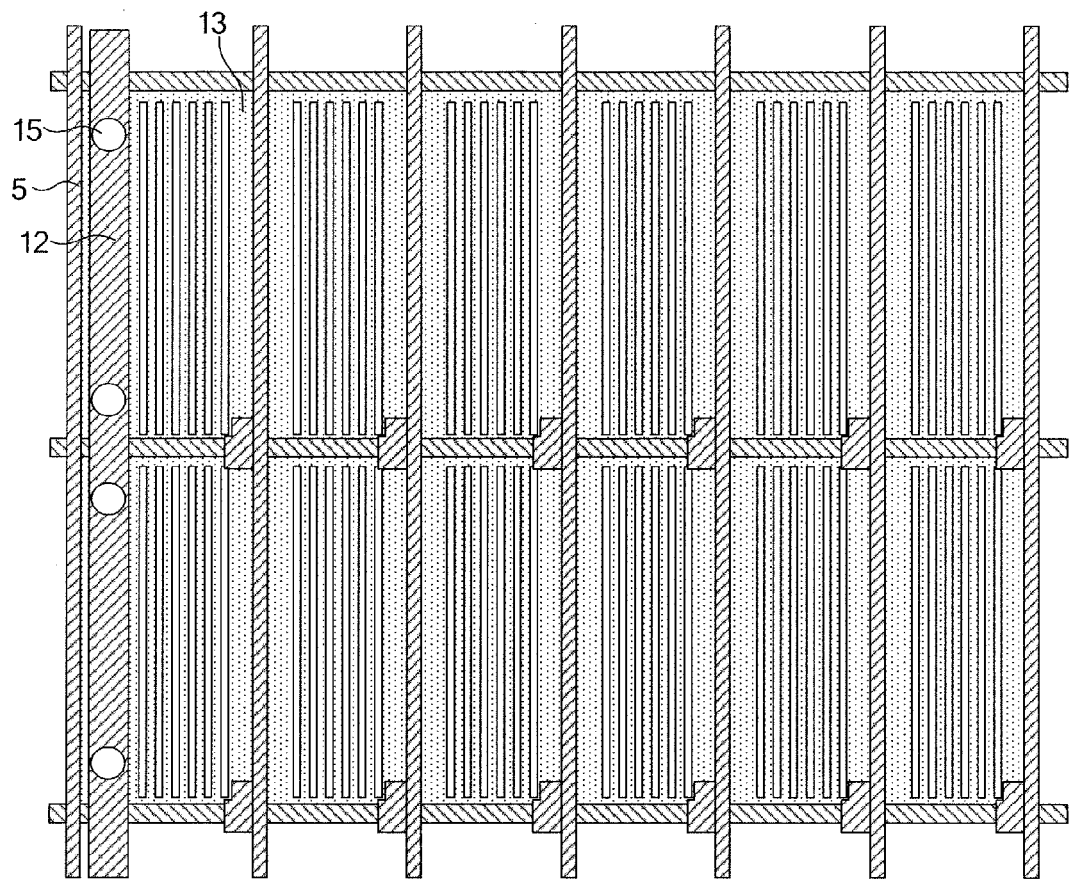
FIG. 6A is a structural diagram of example 1 of the array substrate provided by the first embodiment of the disclosed technology.

The common electrode line 12 and the data lines 5 are disposed at the same layer and parallel with each other, and the common electrode line 12 is connected with the common electrode 13 through a plurality of contact via holes 16, as shown in FIG. 6A.

FIG. 6A is a structural view of example 1 of the array substrate provided by the first embodiment of the disclosed technology. As shown in FIG. 6A, the common electrode line 12 and the data lines 5 are disposed at the same layer, and they may be parallel with each other and adjacent to each other. The material of the data lines 5 generally uses a metal thin film and its square resistance is low, and the common electrode line 12 and the data lines may be produced simultaneously and comprise a same material; while the common electrode generally uses a transparent metal oxide film such as ITO and so on. Thus, the square resistance of the common electrode line 12 is also lower than that of the common electrode 13. After the common electrode line 12 and the common electrode 13 are connected, the common electrode line 12 and the common electrode 13 can be electrically connected in parallel. Since the resistance of the common electrode line 12 is low, the resistance of the common electrode 13 and the common electrode line 12 as a whole can be greatly reduced. The common electrode line 12 is connected with the common electrode 13 through a plurality of contact via holes 15, and this increase the contact points of the common electrode line 12 and the common electrode 13, so the uniformity of the input common voltage ($V_{com}$) signal can be improved. In addition, the common electrode line 12 may be formed through etching by using the same patterning process as the data lines 5, the source and drain electrodes. The contact via holes 15 may be formed through etching by using the same patterning process as the passivation layer (PVX), which does not add the procedures of patterning process when compared with the conventional method and has a good compatibility with conventional method. Herein, the procedure of one patterning process in the embodiment of the disclosed technology comprises the steps of forming a thin film, coating photoresist, exposing and developing, etching and removing the remaining photoresist and so on, and there may be multiple times of etching procedure in one patterning process procedure.

In addition, in the present embodiment, the design of the sub pixel structure is consistent with the conventional design, and the size of the sub pixel structure may be designed according to the size of the common electrode line. The electrical field, formed at the region where the pixel unit is adjacent with the common electrode line 12, is similar to the plain electric field of the transverse electrical field, and light leakage from the pixel will not occur. By etching the contact via holes 15 above the common electrode line 12, the common electrode line 12 can be connected with the common electrode 13.

Example 2

Figure 6B:
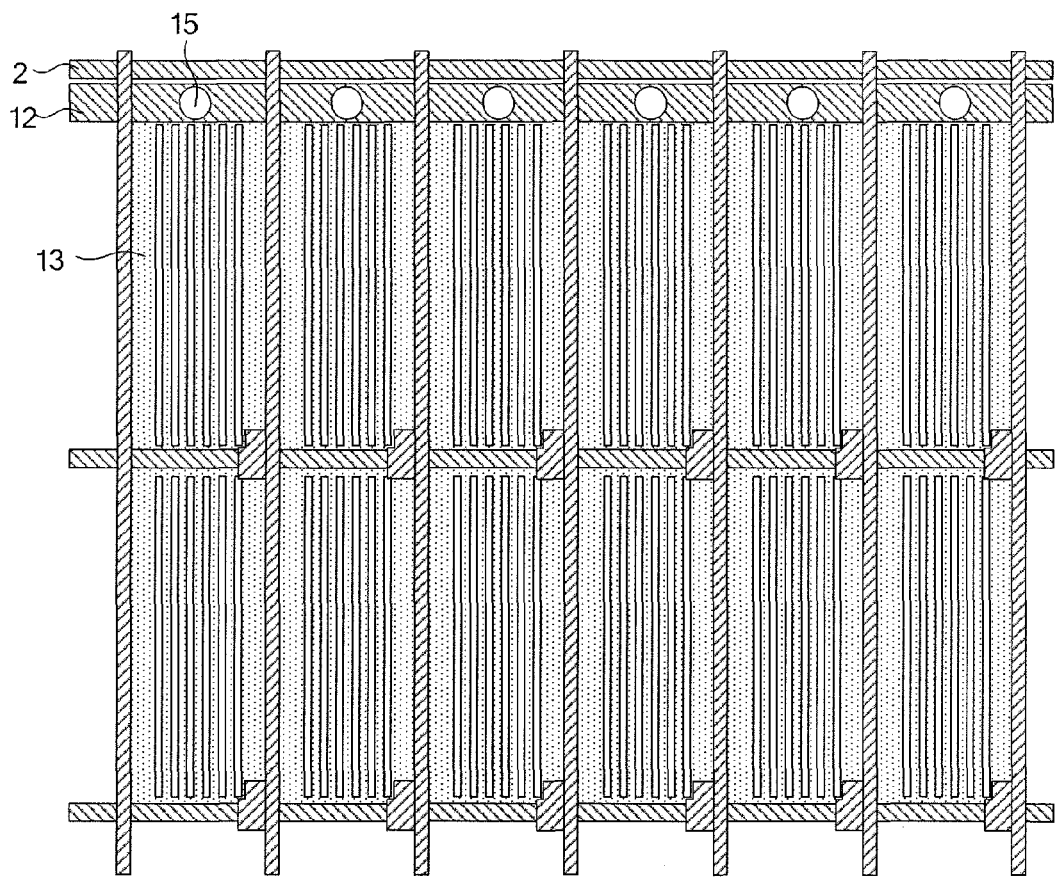
FIG. 6B is a structural diagram of example 2 of the array substrate provided by the first embodiment of the disclosed technology.

The common electrode line 12 and the gate lines 2 are disposed at the same layer and parallel with each other, and the common electrode line 12 is connected with common electrode 13 through a plurality of contact via holes 15, as shown in FIG. 6B.

FIG. 6B is a structural diagram of the second example of the array substrate provided by the first embodiment of the disclosed technology. As shown in FIG. 6B, the common electrode line 12 and the gate lines 2 are disposed at the same layer, and they may be parallel with each other and adjacent to each other. Since the material of the gate lines 2 generally uses a metal thin film and its square resistance is low, and the common electrode line 12 and the gate lines 2 may be produced simultaneously and comprise a same material; the common electrode generally uses a transparent metal oxide film such as ITO and so on, the square resistance of the common electrode line 12 is also lower than that of the common electrode 13. After the common electrode line 12 and the common electrode 13 are connected in parallel, the common electrode line 12 and the common electrode 13 can be electrically connected in parallel; since the resistance of the common electrode line 12 is low, the whole resistance of the common electrode 13 and the common electrode line 12 can be greatly reduced. Moreover, the common electrode line 12 is connected with the common electrode 13 through a plurality of contact via holes 15, which increase the contact points of the common electrode line 12 and the common electrode 13, the uniformity of the input common voltage ($V_{com}$) signal can be improved. In addition, the common electrode line 12 may be formed through etching by using the same patterning process as the gate lines 2 and the gate electrodes. The contact via holes 15 may be formed through etching by using the same patterning process as the passivation layer (PVX), which may not add the procedures of pattern process, and has a good compatibility with the conventional method.

In addition, by etching the contact via holes 15 above the common electrode line 12, the common electrode line 12 can be connected with the ITO layer of the common electrode 13.

Example 3

Figure 6C:
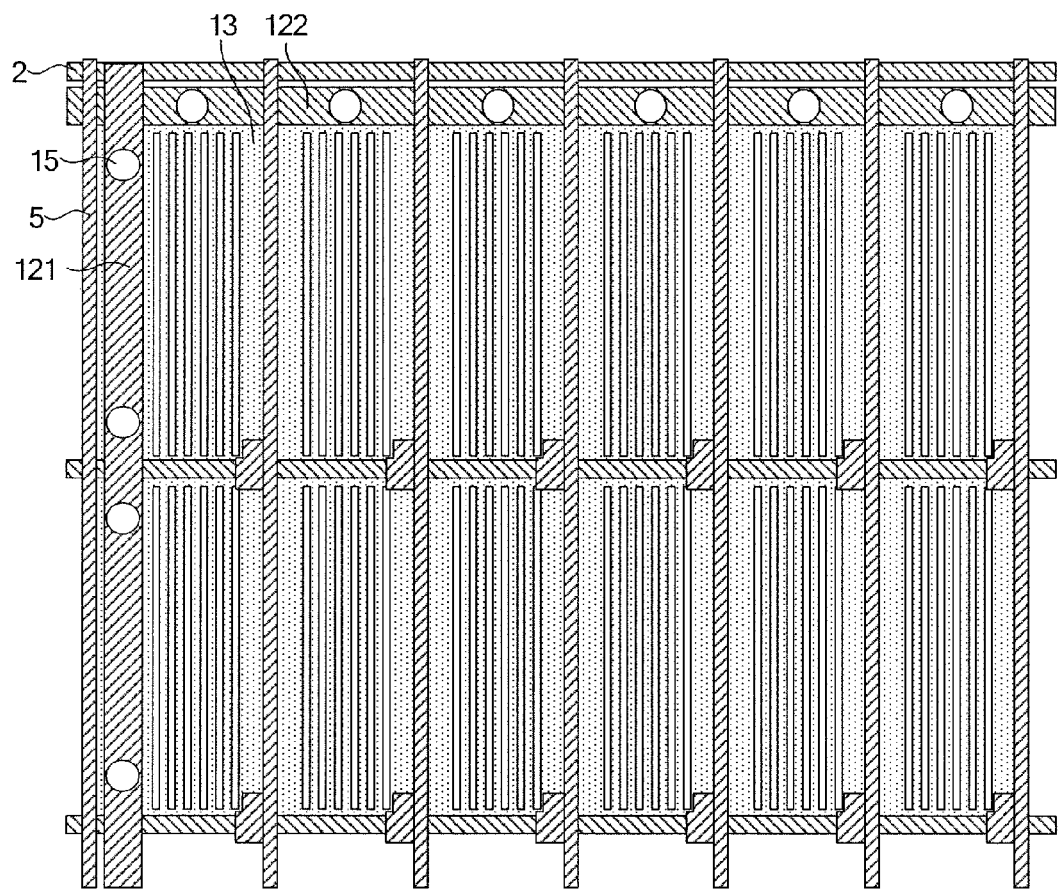
FIG. 6C is a structural diagram of example 3 of the array substrate provided by the first embodiment of the disclosed technology.

The common electrode line comprises a first common electrode line 121 and a second common electrode line 122, wherein the first common electrode line 121 and the data lines 5 are disposed at the same layer and parallel with other, and the second common electrode line 122 and the gate lines 2 are disposed at the same layer and parallel with other, and the first common electrode line 121 and the second common electrode line 122 are respectively connected with the common electrode 13 through the contact via holes 15 and the contact via holes 15, as shown in FIG. 6C.

FIG. 6C is a structural diagram of the third example of the array substrate provided by the first embodiment of the disclosed technology.

As shown in FIG. 6C, the common electrode line comprises the first common electrode line 121 and the second common electrode line 122. The first common electrode line 121 and the data lines 5 are disposed at the same layer, and they may be parallel with each other and adjacent to each other. The first common electrode line 121 and the data lines 5 may be produced simultaneously and comprise a same material. The second common electrode line 122 and the gate lines 2 are disposed at the same layer, and they may be parallel with each other and adjacent to each other. The second common electrode line 121 and the gate lines 2 may be produced simultaneously and comprise a same material. Since the materials of the data lines 5 and the gate lines 2 generally uses metal thin films and their square resistance are low, while the common electrode generally uses a transparent metal oxide film such as ITO and so on, thus the square resistances of the first common electrode line 121 and the second common electrode line 122 are also lower than that of the common electrode 13.

In addition, by etching the contact via holes 15 and the contact via holes 15 above the common electrode lines 121 and 122, the common electrode lines 121 and 122 may be respectively connected with the ITO layer of the common electrode 13.

Except the exemplified manners in the embodiment of the disclosed technology, the position of the common electrode line may be in other manners, for example, the common electrode line may be directly formed on the common electrode, in which case the common electrode line is directly overlap-connected with the common electrode, so the contact points of the common electrode line and the common electrode increase, and a parallel circuit may also be formed, which reduce the resistance of the common electrode and the common electrode line as a whole.

The material of the common electrode line comprises a metal or a metal oxide. If the common electrode line and the data lines or the gate lines are produced simultaneously, the material of the common electrode line may be of the same metal as that of the data lines or the gate lines. If the common electrode line is produced independently, it may be produced by other material, such as a metal oxide and so on.

Still further, there are provided a plurality of common electrode lines, the number of the rows or columns of the pixel electrodes is a multiple of the number of the common electrode lines, and the common electrodes are uniformly and spacedly distributed in the pixel region, as shown in FIGS. 6A, 6B and 6C, rows or columns of the pixel units share one common electrode line.

For example, two, three, four or more columns of the pixel units share one common electrode line, thus the aperture ratio can be improved. In addition, since the passivation layer (PV) on the common electrode line 12 is penetrated, the width of common electrode line 12 may be more than 10 μm. The size of the contact via hole is generally 7~8 μm. To make the ITO layer and the source/drain electrodes contact well, it requires a margin of 2.5 μm at left and right respectively, thus it is preferred that the width of the common electrode line is more than 10 μm. Of course, the width of the common electrode line may be of another size, and a choice can be made according to the specific application. When columns of pixels share one common electrode line 12, the gap between the data lines 5 and the common electrode line 12 can be saved, so as to increase the line width of the common electrode line 12.

In the present embodiment, the common electrode line is formed in the pixel region of the array substrate of the liquid crystal display, and the common electrode line and the common electrode are connected in parallel, and the resistance of the common electrode can be reduced. The common electrode line and the data lines or the gate lines may be disposed at the same layer, and the common electrode line may be formed by using the same material as the data lines or the gate lines, in which case the square resistance of the material of the common electrode line is lower than that of the material of the common electrode, the common electrode line and the common electrode are connected in parallel, the resistance of the common electrode may be further reduced; thereby the RC signal delay of the common electrode can be reduced, and the loading ability of the common voltage signal can be improved. Thus, the crosstalk phenomenon can be alleviated, and the picture quality of the liquid crystal display can be improved.

Second Embodiment

According to the second embodiment of the disclosed technology, a method of manufacturing an array substrate is provided. The method of the embodiment comprises: forming gate lines, switching elements, data lines, pixel electrodes and a common electrode in the pixel region of the base substrate, wherein the common electrode is a plate-shaped electrode having slits and arranged in the whole pixel region;

The manufacturing method of the array substrate further comprises: in the pixel region, forming the pattern of the common electrode line at the same layer with the gate lines and/or the data lines, wherein the common electrode line and the gate lines and/or the data lines are parallel with each other; and connecting the common electrode and the common electrode line.

The common electrode line is formed in the pixel region of the array substrate of the liquid crystal display, and the common electrode line and the common electrode are connected in parallel, and reduce the resistance of the common electrode; the common electrode line and the gate lines and/or the data lines are disposed at the same layer, and the common electrode line may be made by using the same material as the gate lines and/or the data lines, in which case the square resistance of the material of the common electrode line is lower than that of the material of the common electrode, and the common electrode line and the common electrode are connected in parallel, which may further reduce the whole resistance of the common electrode; thereby the RC signal delay can be reduced, and the loading ability of the common voltage signal can be improved. Thus, the crosstalk phenomenon can be alleviated, and the picture quality of the liquid crystal display can be improved.

Subsequently, examples of the manufacturing method of the array substrate will be described below.

Example 1

According to the first example of the present embodiment of the disclosed technology, in the manufacturing method of the array substrate, the formation of the gate lines, switching elements, the data lines, the pixel electrodes, the common electrode and the common electrode line in the pixel region of the base substrate comprises:

Step 101: forming the pattern comprising the gate lines and the gate electrodes on the base substrate through a patterning process.

Figure 7A:
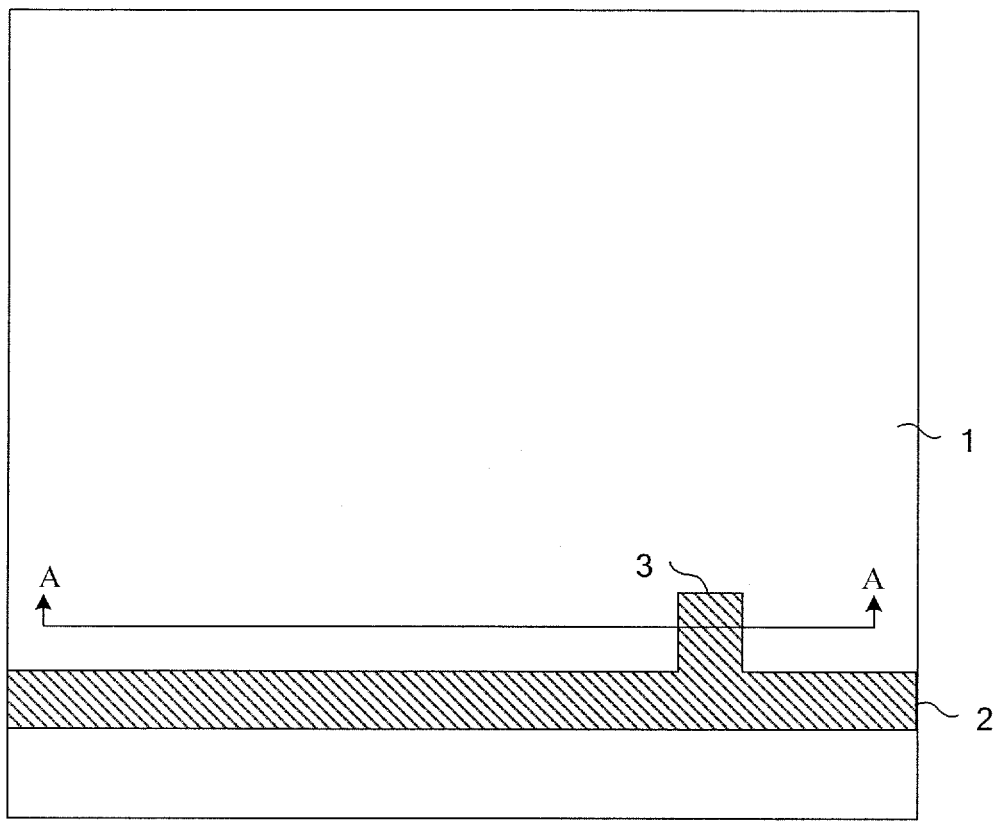
FIG. 7A is a partial top structural diagram of the array substrate on which the gate lines and the gate electrodes are formed, in the manufacturing method provided by the first example of the second embodiment of the disclosed technology.
Figure 7B:
FIG. 7B is a side sectional structural diagram along the line A-A in FIG. 7A.

FIG. 7A is a partial top structural diagram of the array substrate on which the gate lines and the gate electrodes are formed, in the manufacturing method provided by the first example of the second embodiment of the disclosed technology, and FIG. 7B is a side sectional structural diagram along the line A-A in FIG. 7A. As shown in FIG. 7A and FIG. 7B, a gate metal thin film is deposited on the base substrate 1; a photoresist is coated; exposing and developing are performed on the photoresist; the gate metal thin film is etched to form the pattern comprising the gate lines 2 and the gate electrodes 3; then the remaining photoresist is removed.

Step 102: form a gate insulation layer on the base substrate with the above pattern formed; subsequently, form the pattern comprising the data lines, the common electrode line, the source and drain electrodes and the active layer on the base substrate formed with the above pattern through a patterning process.

Figure 7C:
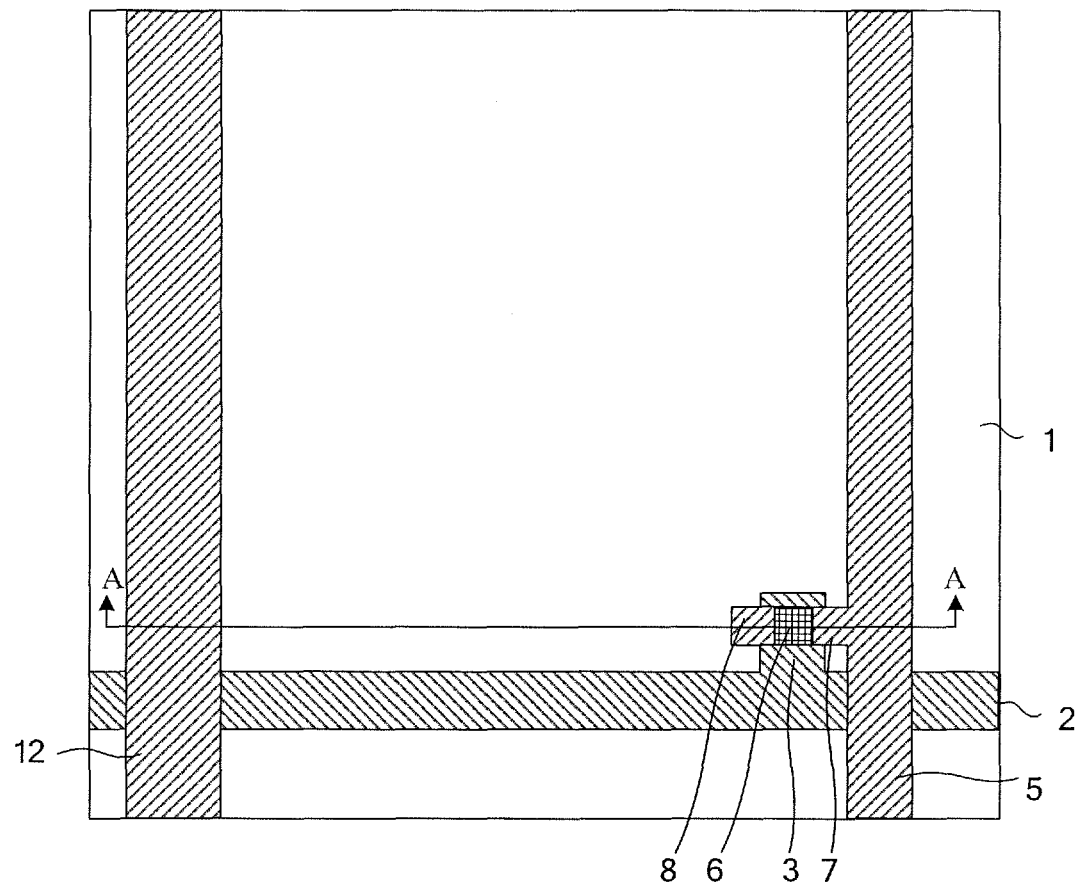
FIG. 7C is a partial top structural diagram of the array substrate on which the data lines, the common electrode line, the source and drain electrodes and the active layer are formed, in the manufacturing method provided by the first example of the second embodiment of the disclosed technology.
Figure 7D:
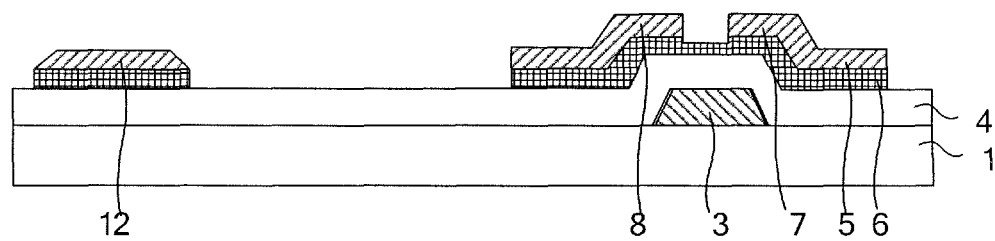
FIG. 7D is a side sectional structural diagram along the line A-A in FIG. 7C.

The step 102 may comprise one photolithography procedure: forming the pattern comprising the data lines, the common electrode line, the source and drain electrodes and the active layer on the base substrate formed with the above pattern through one patterning process. FIG. 7C is a partial top structural diagram of the array substrate on which the data lines, the common electrode line, the source and drain electrodes and the active layer are formed, in the manufacturing method provided by the first example of the second embodiment of the disclosed technology, and FIG. 7D is a side sectional structural diagram along the line A-A in FIG. 7C. After forming the gate insulation layer 4 on the base substrate formed with the above pattern, the following are performed: forming an active layer thin film and a data line thin film on the base substrate formed with the above pattern; coating photoresist; performing exposing and developing on the photoresist by using a dual tone mask plate, to form a photoresist pattern comprising a completely remained region, a half remained region and a completely removed region; etching the active thin film and the data line thin film corresponding to the completely remained region, to form the pattern comprising the data lines 5, the active layer 6, and the common electrode line 12; etching the data line thin film and the active layer corresponding to the half remained region, to form the pattern comprising TFT channels, the source electrodes 7 and the drain electrodes 8; then removing the remaining photoresist.

Figure 7E:
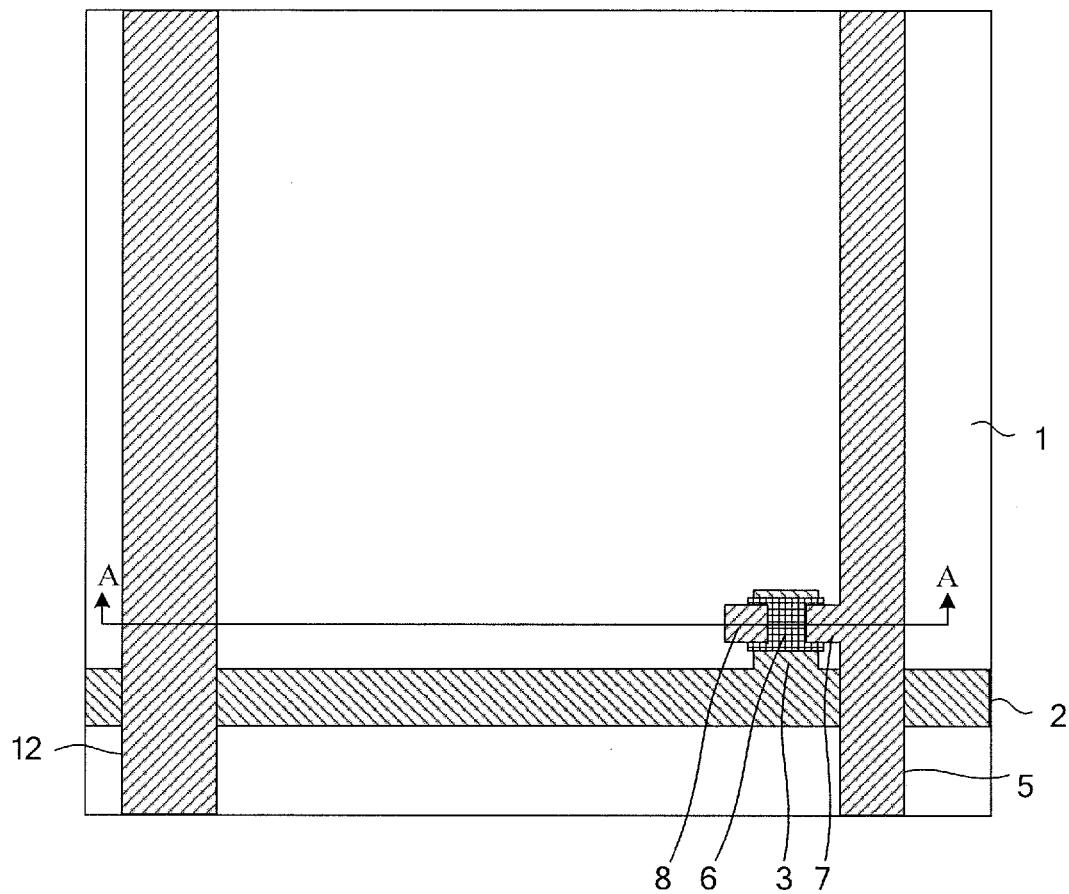
FIG. 7E is another partial top structural diagram of the array substrate on which the data lines, the common electrode line, the source and drain electrodes and the active layer are formed, in the manufacturing method provided by the first example of the second embodiment of the disclosed technology.
Figure 7F:
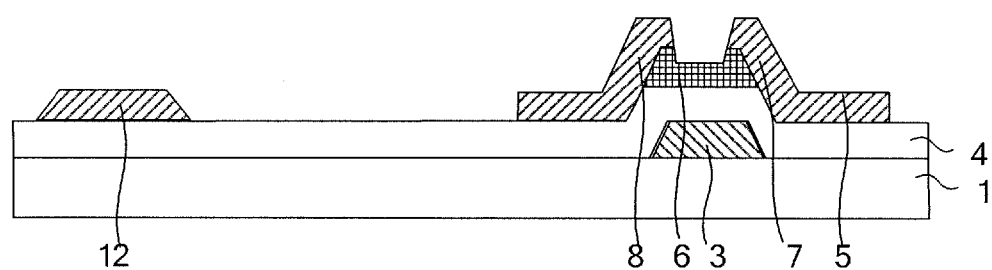
FIG. 7F is a side sectional structural diagram along the line A-A in FIG. 7E.

The step 102 may also comprise two photolithography procedures: forming the pattern comprising the data lines, the common electrode line, the source and drain electrodes and the active layer, on the base substrate formed with the above pattern through a double-patterning process. FIG. 7E is another partial top structural diagram of the array substrate on which the data lines, the common electrode line, the source and drain electrodes and the active layer are formed, in the manufacturing method provided by the first example of the second embodiment of the disclosed technology, and FIG. 7F is a side sectional structural diagram along the line A-A in FIG. 7E. As shown in FIG. 7E and FIG. 7F, after forming a gate insulation layer on the base substrate formed with the above pattern, the following are performed: forming an active layer thin film on the base substrate 1 formed with the above pattern; coating photoresist; performing exposing and developing on the photoresist by using a single tone mask plate; etching the active layer thin film to form the pattern comprising the active layer 6; then removing the remaining photoresist; forming a data line metal thin film on the base substrate 1 formed with the above pattern; coating photoresist; performing exposing and developing on the photoresist by using a single tone mask plate; etching the data line metal thin film to form the pattern comprising the data lines 5, the common electrode line 12, the source electrodes 7 and the drain electrodes 8; then removing the remaining photoresist.

Step 103: forming the pattern comprising pixel electrodes on the base substrate formed with the above pattern through a patterning process, wherein each pixel electrode is overlap-connected with the drain electrode.

Figure 7G:
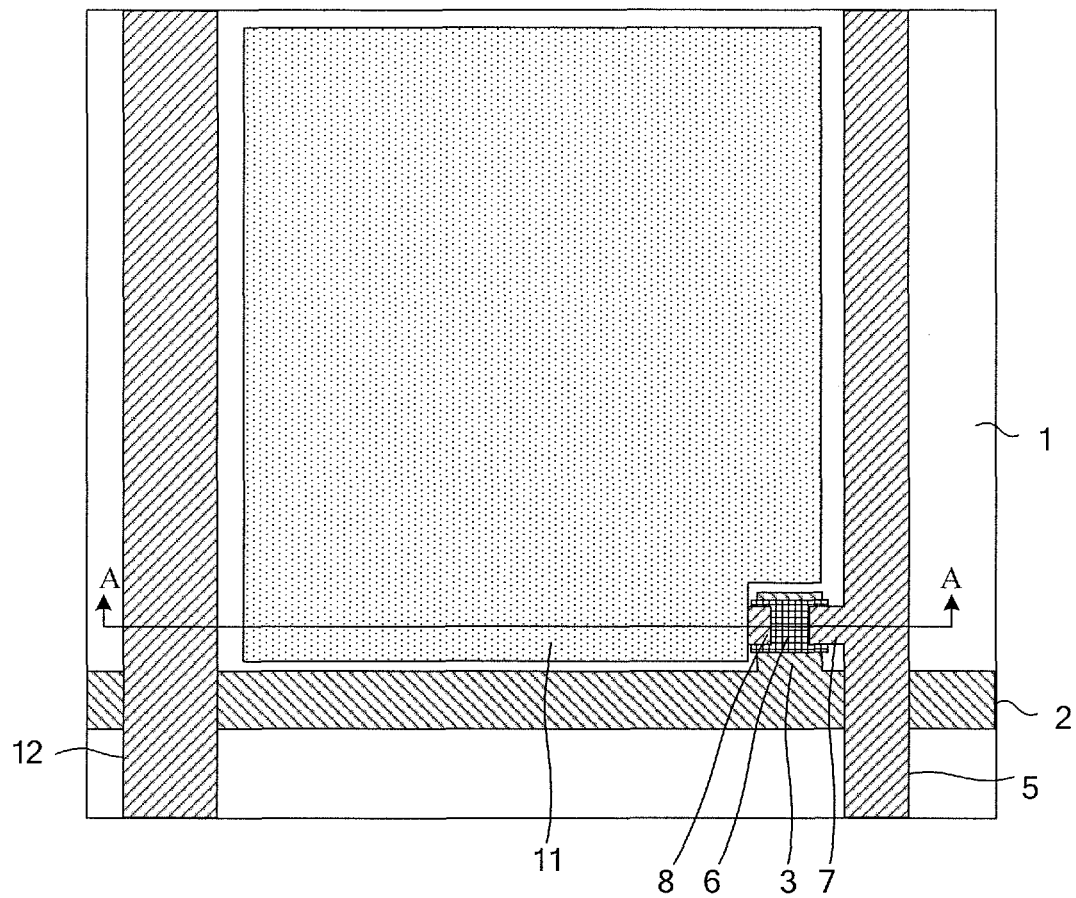
FIG. 7G is a partial top structural diagram of the array substrate on which the pixel electrode is formed, in the manufacturing method provided by the first example of the second embodiment of the disclosed technology.
Figure 7H:
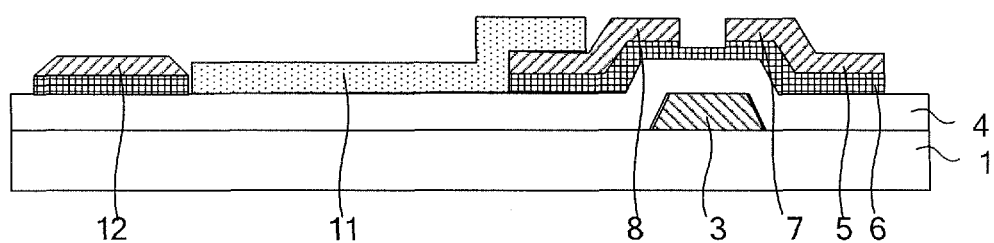
FIG. 7H is a side sectional structural diagram along the line A-A in FIG. 7G.

FIG. 7G is a partial top structural diagram of the array substrate on which pixel electrodes are formed, in the manufacturing method provided by the first example of the second embodiment of the disclosed technology, and FIG. 7H is a side sectional structural diagram along the line A-A in FIG. 7G As shown in FIG. 7G and FIG. 7H, a first layer of transparent conductive thin film is formed on the base substrate formed with the above pattern, and after photoresist is coated, the following are performed: performing exposing and developing on the photoresist by using a single tone mask plate; etching the first layer of transparent conductive thin film to form the pattern comprising the pixel electrodes 11, each pixel electrode 11 being overlap-connected with the drain electrode 8 in the corresponding pixel unit; then removing the remaining photoresist.

Step 104: forming a passivation layer on the base substrate formed with the above pattern, and forming a pattern comprising contact via holes through a patterning process.

Figure 7I:
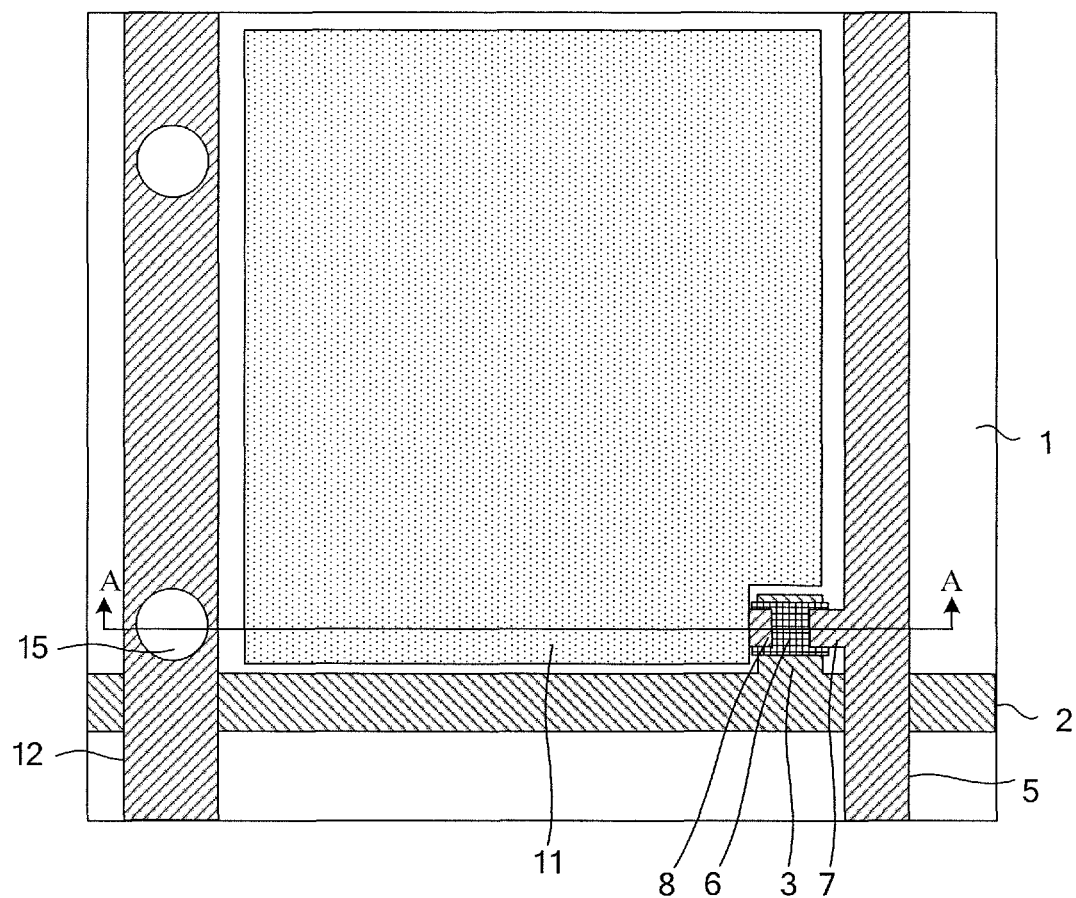
FIG. 7I is a partial top structural diagram of the array substrate on which the contact via holes are formed, in the manufacturing method provided by the first example of the second embodiment of the disclosed technology.
Figure 7J:
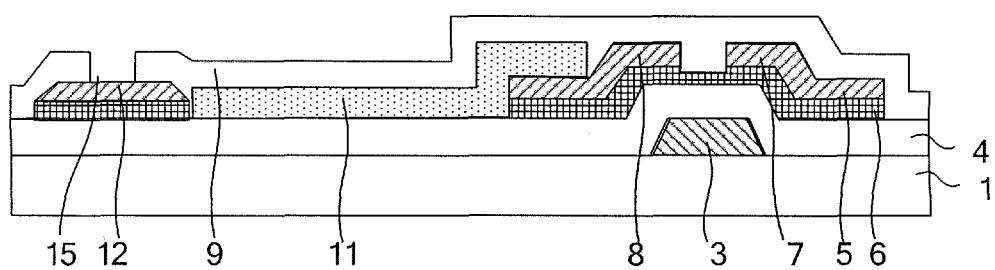
FIG. 7J is a side sectional structural diagram along the line A-A in FIG. 7I.

FIG. 7I is a partial top structural diagram of the array substrate on which contact via holes are formed, in the manufacturing method provided by the first example of the second embodiment of the disclosed technology, and FIG. 7J is a side sectional structural diagram along the line A-A in FIG. 7I. As shown in FIG. 7I and FIG. 7J, after forming a passivation layer 9 on the base substrate 1 formed with the above pattern, photoresist is coated, the exposing and developing are performed on the photoresist by using a single tone mask plate, etching the passivation layer to form the pattern comprising the contact via holes, then removing the remaining photoresist.

Step 105: forming the pattern comprising the common electrode on the base substrate formed with the above pattern through a patterning process, the common electrode line being connected with the common electrode through the contact via holes.

Figure 7K:
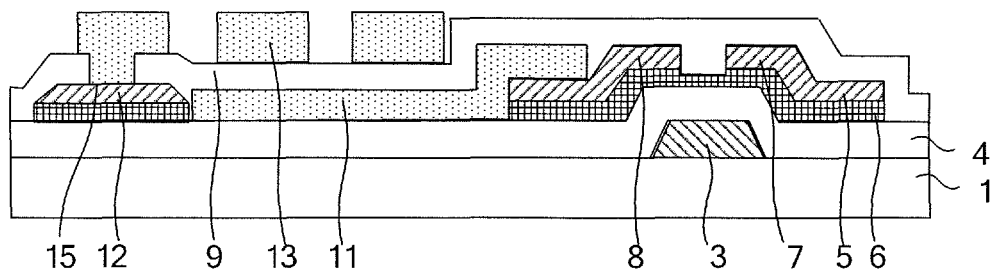
FIG. 7K is a partial top structural diagram of the array substrate on which the common electrode is formed, in the manufacturing method provided by the first example of the second embodiment of the disclosed technology.

FIG. 7K is a partial top structural diagram of the array substrate on which the common electrode is formed, in the manufacturing method provided by the first example of the second embodiment of the disclosed technology. As shown in FIG. 7K, the following are performed: forming a second layer of transparent conductive thin film on the base substrate 1 formed with the above pattern; coating photoresist; performing exposing and developing on the photoresist by using a single tone mask plate; etching the second layer of transparent conductive thin film to form the pattern comprising the common electrode 13, wherein the common electrode line 12 is connected with the common electrode 13 through the contact via holes; then removing the remaining photoresist.

The structure of the array substrate obtained by the present embodiment may refer to the related description of the first example of the second embodiment described above and FIG. 6A.

In the present embodiment, the common electrode line is formed in the pixel region of the array substrate of the liquid crystal display, and the common electrode line and the common electrode are connected in parallel, and reduce the whole resistance of the common electrode. The common electrode line and the data lines are disposed at the same layer, and the common electrode line may be made by using the same material as the data lines, in which case the square resistance of the material of the common electrode line is lower than that of the material of the common electrode, and the common electrode line and the common electrode are connected in parallel, so the resistance of the common electrode can be further reduced; thereby the RC signal delay of the common electrode can be reduced, and the loading ability of the common voltage signal can be improved. Thus, the crosstalk phenomenon can be alleviated, and the picture quality of the liquid crystal display can be improved.

Example 2

According to the second example of the present embodiment of the disclosed technology, in the manufacturing method of the array substrate, forming the gate lines, the switching elements, the data lines, the pixel electrodes, the common electrode and the common electrode line in the pixel region of the base substrate comprises:

Step 201: for the pattern comprising the gate lines, the gate electrodes and the common electrode line on the base substrate through a patterning process.

Figure 8A:
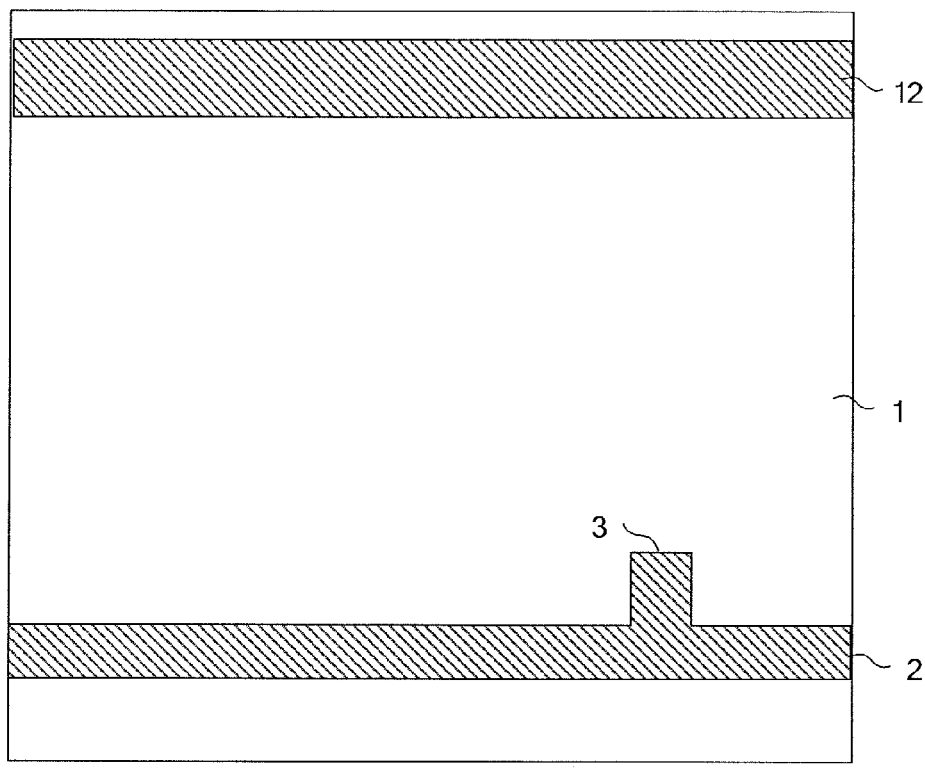
FIG. 8A is a partial top structural diagram of the array substrate on which the gate lines, the gate electrodes and the common electrode line are formed, in the manufacturing method provided by the second example of the second embodiment of the disclosed technology.

FIG. 8A is a partial top structural diagram of the array substrate on which the gate lines, the gate electrodes and the common electrode line are formed, in the manufacturing method provided by the second example of the second embodiment of the disclosed technology. As shown in FIG. 8A, a gate metal thin film is deposited on the base substrate, photoresist is coated, the exposing and developing are performed on the photoresist by using a single tone mask plate, the gate metal thin film is etched to form the pattern comprising the gate lines 2, the gate electrodes 3 and the common electrode line 12; as shown in FIG. 8A, the pattern comprising the gate lines 12, the gate electrodes 3 and the common electrode line 12 is formed by etching, and then the remaining photoresist is removed.

Step 202: forming a gate insulation layer on the base substrate formed with the above pattern; then, forming the pattern comprising the data lines, the source and drain electrodes and the active layer on the base substrate formed with the above pattern through the patterning process.

Figure 8B:
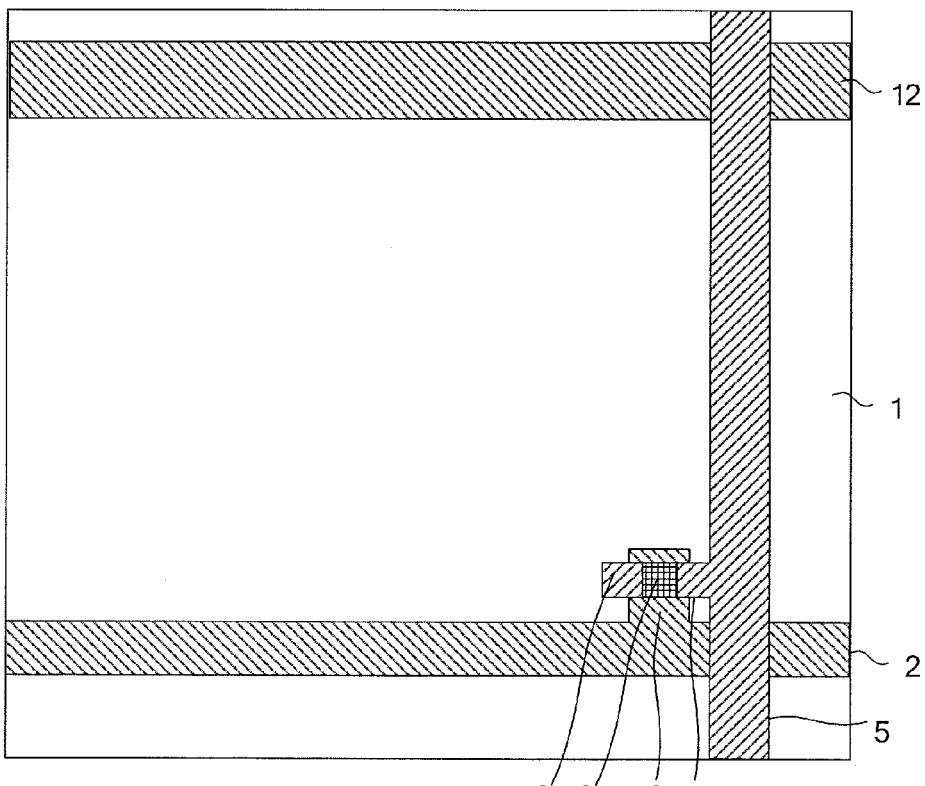
FIG. 8B is a partial top structural diagram of the array substrate on which the data lines, the common electrode line, the source and drain electrodes and the active layer are formed, in the manufacturing method provided by the second example of the second embodiment of the disclosed technology.

The step 202 may comprise one photolithography procedure: forming the pattern comprising the data lines, the source and drain electrodes and the active layer on the base substrate formed with the above pattern through one patterning process. FIG. 8B is a partial top structural diagram of the array substrate on which the data lines, the common electrode line, the source and drain electrodes and the active layer are formed, in the manufacturing method provided by the second example of the second embodiment of the disclosed technology. After forming a gate insulation layer on the base substrate 1 formed with the above pattern, the following are performed: forming an active layer thin film and a data line metal thin film on the base substrate 1 formed with the above pattern; coating the photoresist; performing exposing and developing on the photoresist by using a dual tone mask plate, to form a photoresist pattern comprising a completely remained region, a half remained region and a completely removed region; etching the active layer thin film and the data line metal thin film corresponding to the completely remained region, to form the pattern comprising the data lines 5 and the active layer 6; etching the data line metal thin film corresponding to the half remained region, to form the pattern comprising TFT channels, the source electrodes 7 and the drain electrodes 8; then removing the remaining photoresist.

Figure 8C:
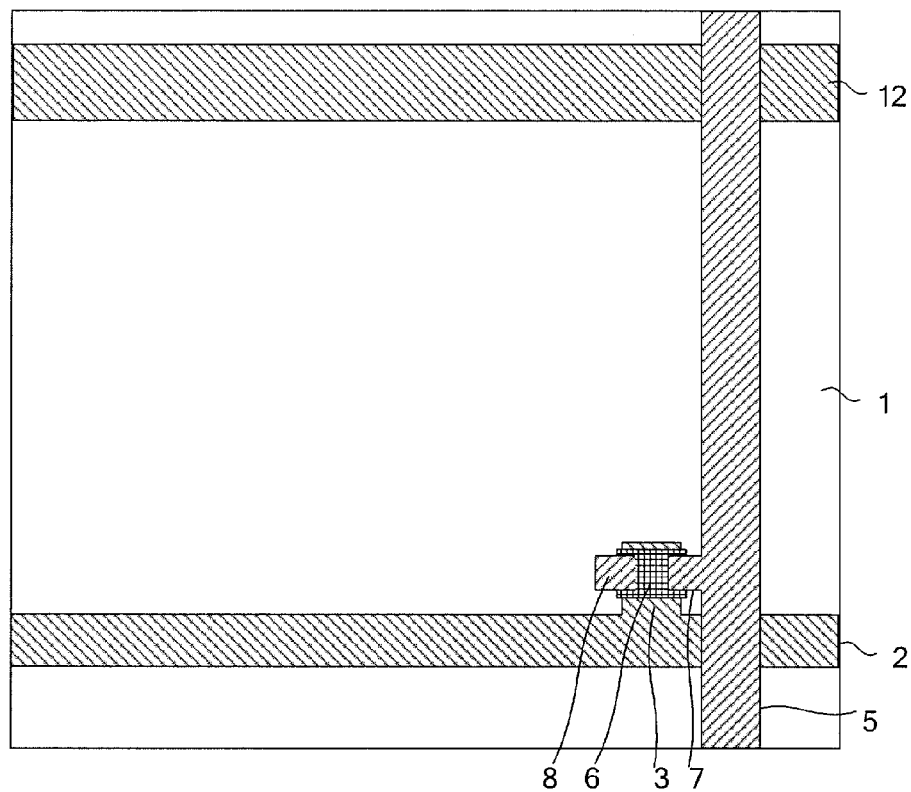
FIG. 8C is another partial top structural diagram of the array substrate on which the data lines, the common electrode line, the source and drain electrodes and the active layer are formed, in the manufacturing method provided by the second example of the second embodiment of the disclosed technology.

The step 202 may also comprise two photolithography procedures: forming the pattern comprising the data lines, the source and drain electrodes and the active layer, on the base substrate formed with the above pattern through a double-patterning process. FIG. 8C is another partial top structural diagram of the array substrate on which the data lines, the common electrode line, the source and drain electrodes and the active layer are formed, in the manufacturing method provided by the second example of the second embodiment of the disclosed technology. After forming a gate insulation layer on the base substrate formed with the above pattern, the following are performed: forming an active layer thin film on the base substrate 1 formed with the above pattern; coating photoresist; performing exposing and developing on the photoresist by using a single tone mask plate; etching the active layer thin film to form the pattern comprising the active layer 6; then removing the remaining photoresist; forming a data line metal thin film on the base substrate 1 formed with the above pattern; coating the photoresist; performing exposing and developing on the photoresist by using a single tone mask plate; etching the data line metal thin film to form the pattern comprising the data lines 5, the source electrodes 7 and the drain electrodes 8; and then removing the remaining photoresist.

Step 203: forming the pattern comprising the pixel electrodes on the base substrate formed with the above pattern through a patterning process, each pixel electrode being overlap-connected with the drain electrode in the corresponding pixel unit.

Figure 8D:
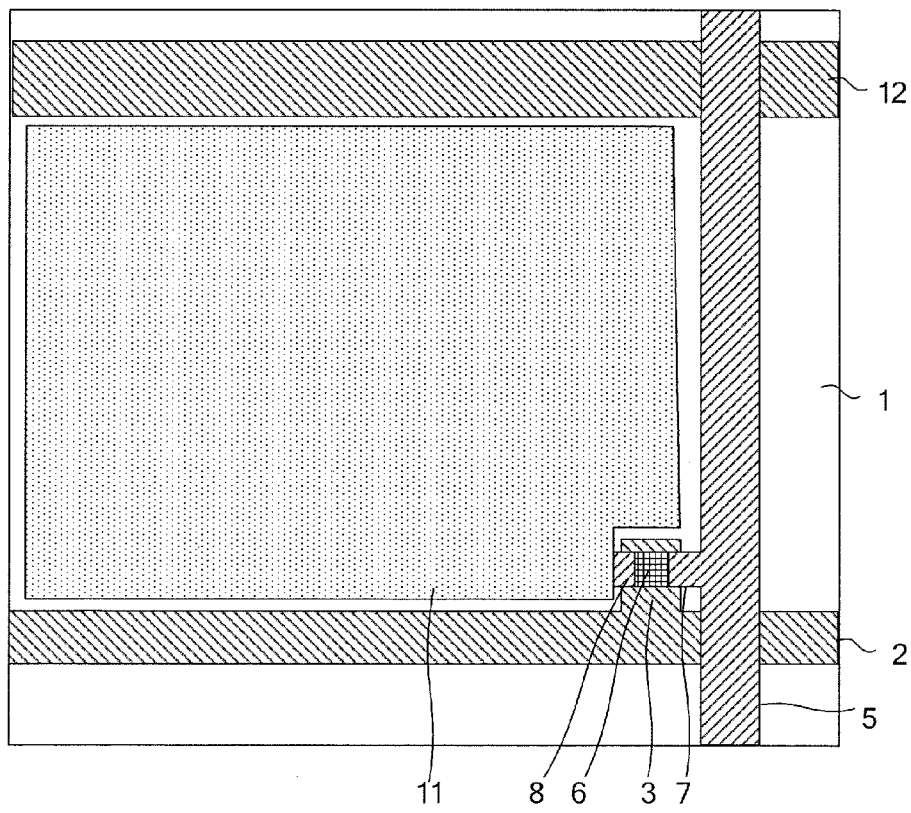
FIG. 8D is a partial top structural diagram of the array substrate on which the pixel electrode is formed, in the manufacturing method provided by the second example of the second embodiment of the disclosed technology.

FIG. 8D is a partial top structural diagram of the array substrate on which the pixel electrodes are formed, in the manufacturing method provided by the second example of the second embodiment of the disclosed technology. The following are performed: forming a first layer of transparent conductive thin film on the base substrate formed with the above pattern; coating photoresist; performing exposing and developing on the photoresist by using a single tone mask plate; etching the first layer of transparent conductive thin film to form the pattern comprising the pixel electrodes 11, each pixel electrode 11 being overlap-connected with the drain electrode 8 in the corresponding pixel unit; and then removing the remaining photoresist.

Step 204: forming a passivation layer on the base substrate formed with the above pattern, and forming a pattern comprising contact via holes through a patterning process.

Figure 8E:
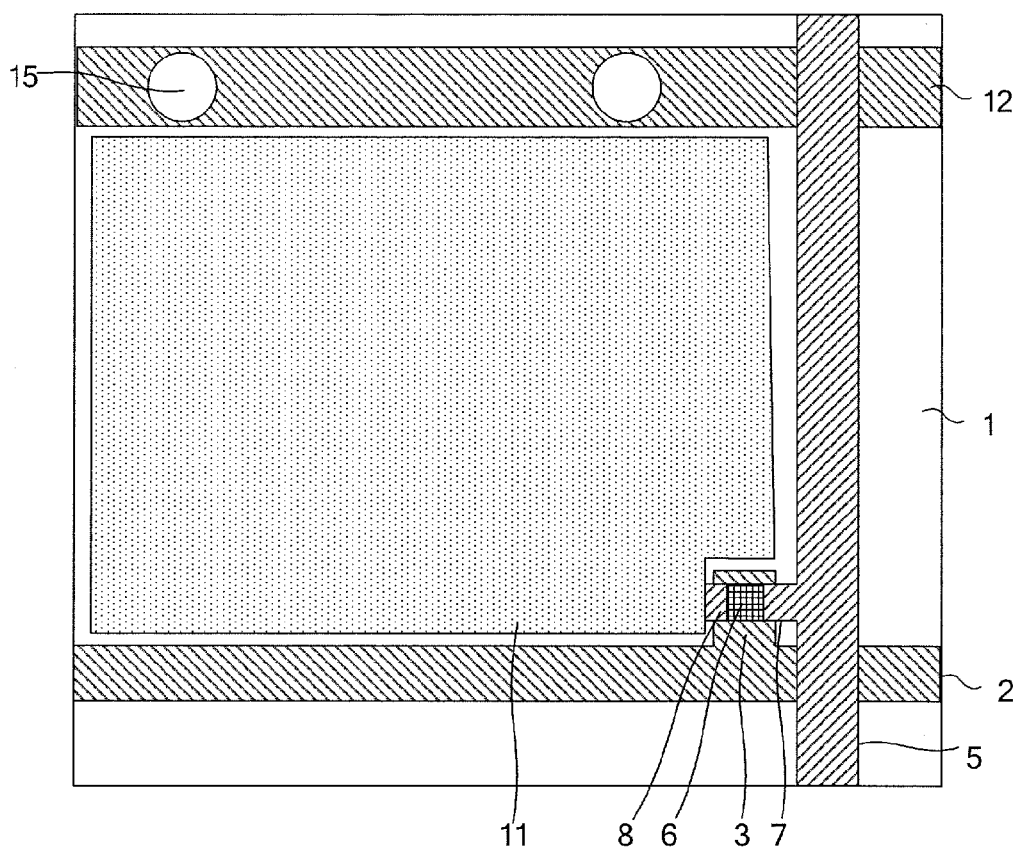
FIG. 8E is a partial top structural diagram of the array substrate on which contact via holes are formed, in the manufacturing method provided by the second example of the second embodiment of the disclosed technology.

FIG. 8E is a partial top structural diagram of the array substrate on which contact via holes are formed, in the manufacturing method provided by the second example of the second embodiment of the disclosed technology. After forming a passivation layer on the base substrate 1 formed with the above pattern, the following are performed: coating photoresist; performing exposing and developing on the photoresist by using a single tone mask plate; etching the passivation layer and the gate insulation layer through the patterning process to form the pattern comprising the contact via holes 15; and then removing the remaining photoresist.

Step 205: forming the pattern comprising the common electrode on the base substrate formed with the above pattern through a patterning process, the common electrode line being connected with the common electrode through the contact via holes.

The following are performed: forming a second layer of transparent conductive thin film on the base substrate formed with the above pattern; coating photoresist; performing exposing and developing on the photoresist by using a single tone mask plate; etching the second layer of transparent conductive thin film to form the pattern comprising the common electrode, wherein the common electrode line being connected with the common electrode through the contact via holes; and then removing the remaining photoresist.

The structure of the array substrate obtained by the present embodiment may refer to the related description of the second example of the second embodiment described above and shown in FIG. 6B.

In the present embodiment, the common electrode line is formed in the pixel region of the array substrate of the liquid crystal display, and the common electrode line and the common electrode are connected in parallel, and reduce the whole resistance of the common electrode; the common electrode line and the gate lines are disposed at the same layer, and the common electrode line may be formed of the same material as the gate lines, in which case the square resistance of the material of the common electrode line is lower than that of the material of the common electrode, and the common electrode line and the common electrode are connected in parallel, so the resistance of the common electrode may be further reduced; thereby the RC signal delay of the common electrode can be reduced, and the loading ability of the common voltage signal can be improved. Thus, the crosstalk phenomenon can be alleviated, and the picture quality of the liquid crystal display can be improved.

Example 3

According to the third example of the present embodiment of the disclosed technology, in the manufacturing method of the array substrate, forming the gate lines, the switching elements, the data lines, the pixel electrodes, the common electrode and the common electrode line in the pixel region of the base substrate comprises:

Step 301: forming the pattern comprising the gate lines, the gate electrodes and a second common electrode line on the base substrate through a patterning process.

The following are performed: depositing a gate metal thin film on the base substrate; coating photoresist; performing exposing and developing on the photoresist by using a single tone mask plate; etching the gate metal thin film to form the pattern comprising the gate lines 2, the gate electrodes 3 and the second common electrode line 12; and then removing the remaining photoresist. In FIG. 8A, the common electrode line 12 is the second common electrode line.

Step 302: forming a gate insulation layer on the base substrate formed with the above pattern; then, forming the pattern comprising the data lines, a first common electrode line, the source and drain electrodes and the active layer on the base substrate formed with the above pattern through a patterning process.

Figure 9A:
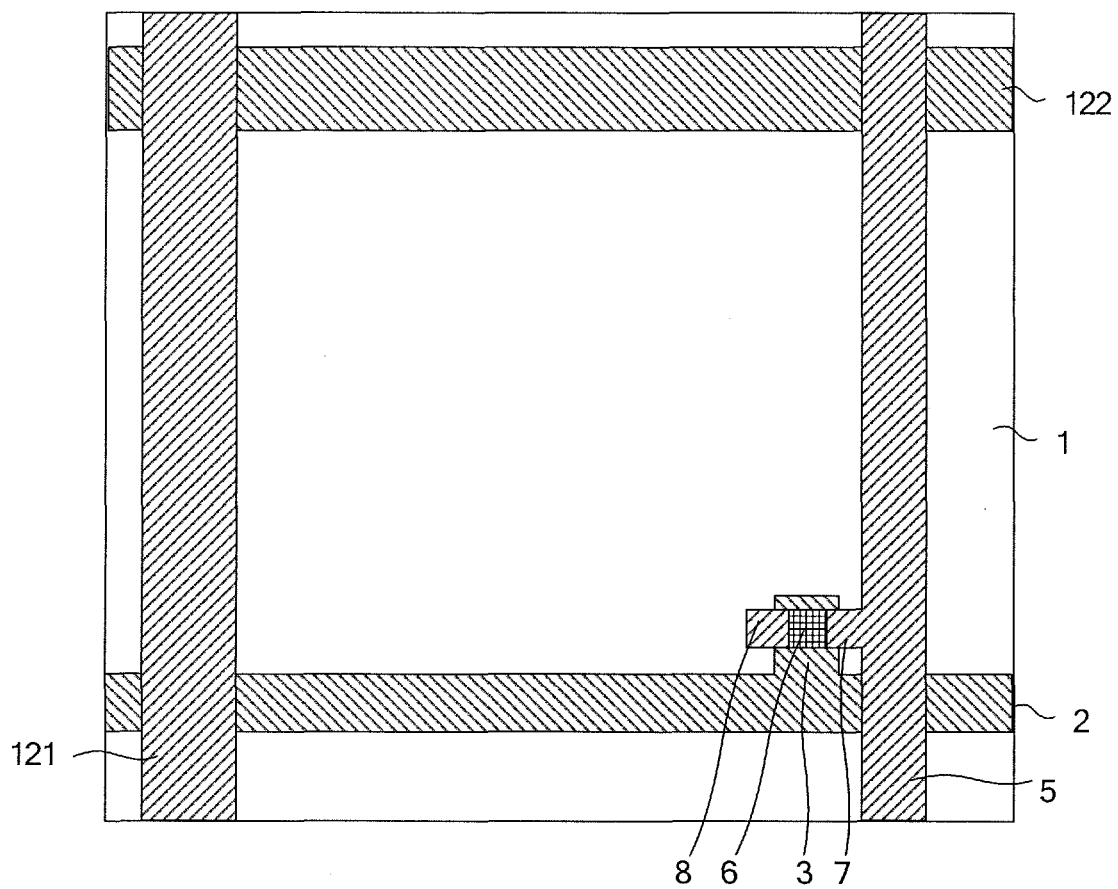
FIG. 9A is a partial top structural diagram of the array substrate on which the data line, the first common electrode line, the source and drain electrodes and the active layer are formed, in the manufacturing method provided by the third example of the second embodiment of the disclosed technology.

The step 302 may comprise one photolithography procedure, or may comprise two photolithography procedures, the detailed method may refer to the related description of the step 102 in the embodiment described above. FIG. 9A is a partial top structural diagram of the array substrate on which the data line, the first common electrode line, the source and drain electrodes and the active layer are formed, in the manufacturing method provided by the third example of the second embodiment of the disclosed technology. After the step 302, two common electrode lines are formed on the base substrate 1, wherein one is the first common electrode line 121 which is disposed at the same layer of the data lines 5 and parallel with the data lines 5, the other one is the second common electrode 122 which is disposed at the same layer of the gate line 3 and parallel with the gate line 3.

Step 303: forming the pattern comprising the pixel electrodes on the base substrate formed with the above pattern through a patterning process, the pixel electrode being overlap-connected with the drain electrode.

Figure 9B:
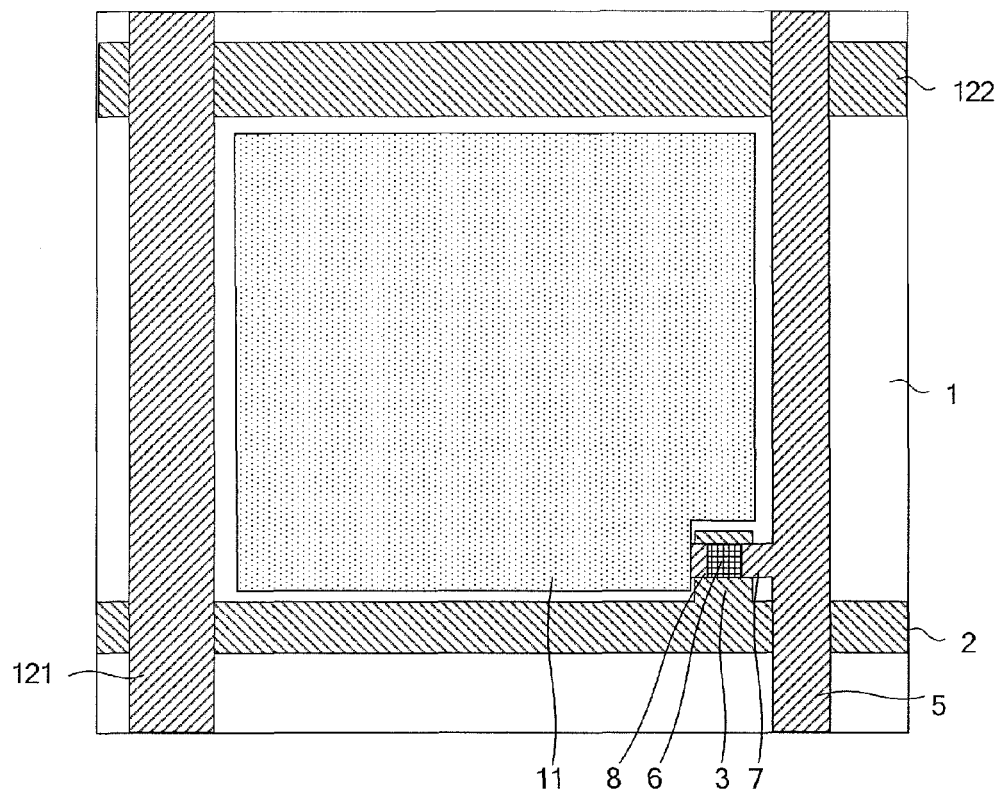
FIG. 9B is a partial top structural diagram of the array substrate on which the pixel electrode are formed, in the manufacturing method provided by the third example of the second embodiment of the disclosed technology.

FIG. 9B is a partial top structural diagram of the array substrate on which the pixel electrode are formed, in the manufacturing method provided by the third example of the second embodiment of the disclosed technology. As shown in FIG. 9B, the following are performed: forming a first layer of transparent conductive thin film on the base substrate 1 formed with the above pattern; coating photoresist; performing exposing and developing on the photoresist by using a single tone mask plate; etching the first layer of transparent conductive thin film to form the pattern comprising the pixel electrodes 11, each pixel electrode 11 being overlap-connected with the drain electrode 8 in the corresponding pixel unit; and then removing the remaining photoresist.

Step 304: forming a passivation layer on the base substrate formed with the above pattern, and forming a pattern comprising contact via holes through a patterning process.

Figure 9C:
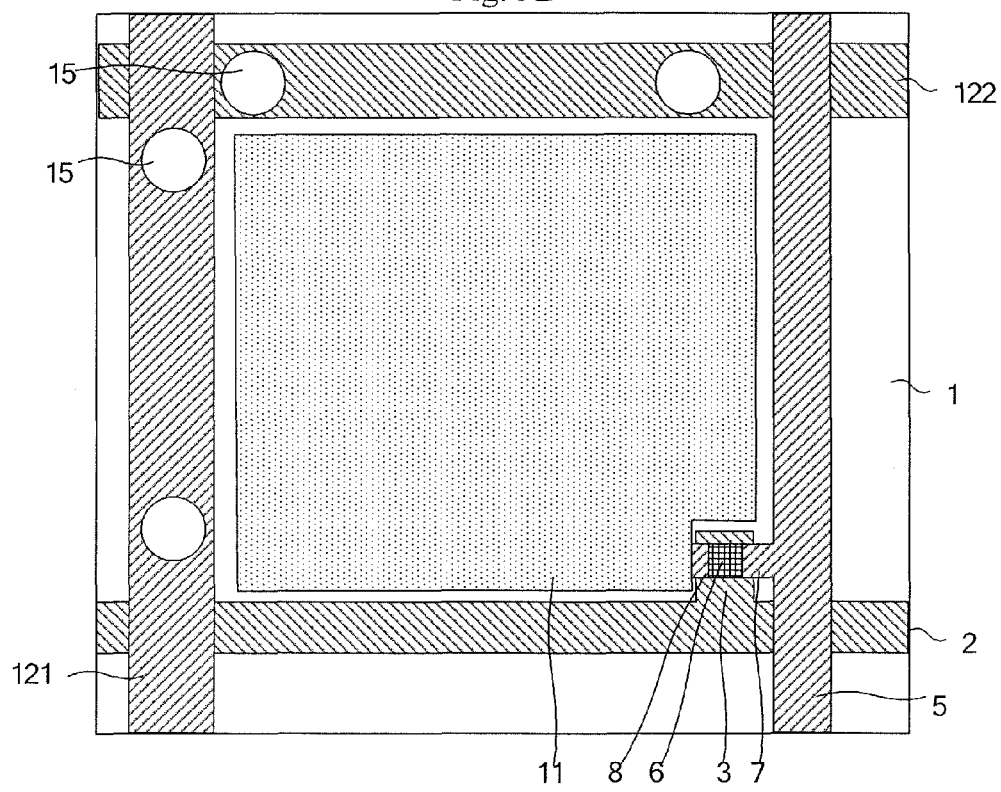
FIG. 9C is a partial top structural diagram of the array substrate on which the contact via holes are formed, in the manufacturing method provided by the third example of the second embodiment of the disclosed technology.

FIG. 9C is a partial top structural diagram of the array substrate on which the contact via holes are formed, in the manufacturing method provided by the third example of the second embodiment of the disclosed technology. As shown in FIG. 9C, after forming a passivation layer on the base substrate 1 formed with the above pattern, the following are performed: coating photoresist; performing exposing and developing on the photoresist by using a single tone mask plate; etching the passivation layer and the gate insulation layer to form the contact via holes 15 above the first common electrode line 121; and then removing the remaining photoresist.

Step 305: forming the pattern comprising the common electrode on the base substrate formed with the above pattern through a patterning process, the first common electrode line and the first common electrode line being respectively connected with the common electrode through the contact via holes.

The following are performed: forming a second layer of transparent conductive thin film on the base substrate formed with the above pattern; coating photoresist; performing exposing and developing on the photoresist by using a single tone mask plate; etching the second layer of transparent conductive thin film to form the pattern comprising the common electrode, the second common electrode line and the first common electrode line being respectively connecting with the common electrode through the contact via holes; and then removing the remaining photoresist.

The structure of the array substrate obtained by the present embodiment may refer to the related description of the third example of the second embodiment described above and shown in FIG. 6C.

In the present embodiment, the common electrode line is formed in the pixel region of the array substrate of the liquid crystal display, and the common electrode line and the common electrode are connected in parallel, and reduce the whole resistance of the common electrode; the common electrode lines are respectively disposed at the same layer as the data lines and the gate lines, and may be formed of the same material of the data lines and the gate lines, in which case the square resistance of the material of the common electrode line is lower than that of the material of the common electrode, and the common electrode line and the common electrode are connected in parallel, so the resistance of the common electrode may be further reduced; thereby the RC signal delay of the common electrode can be reduced, the loading ability of the common voltage signal can be improved; thus, the crosstalk phenomenon can be alleviated, and the picture quality of the liquid crystal display can be improved.

In the array substrate structure of the above embodiment of the disclosed technology, as shown, the data lines are vertically disposed and the gate lines are horizontally disposed. In operation, the directions of the data lines and the gate lines may be changed according to the demand. For example, the data lines are horizontally disposed and the gate lines are vertically disposed. Moreover, the above embodiments of the disclosed technology only exemplified several structures of the array substrate, and the sequences between the respective film layers may be changed according to the demand.

In addition, except the above described examples, in the manufacturing method of the array substrate according to the second embodiment of the disclosed technology, the common electrode line may also be directly formed on the common electrode, at this time, the common electrode line and the common electrode directly overlapping-connect, the contact points of the common electrode line and the common electrode increase, a parallel circuit may also be formed, reduce the whole resistance of the common electrode.

In addition, the comparison of the conventional technology to reduce the crosstalk phenomenon of HFFS with the disclosed technology is discussed in examples.

For example, the conventional technology may increase width of the input line for the common voltage signal and the path of the input signal; however, this method need a bigger sealant region, increasing the size of the liquid crystal panel and decreasing the utility ratio of the glass.

For another example, the conventional technology may increase the thickness of the common electrode material (ITO), reducing the resistance of the common electrode; however, in this method, as the thickness of the ITO increase, the transmittance of the liquid crystal decreases; the transmittance of ITO of various thickness changes according to the wavelength of the incident light, when the thickness of the ITO is increased from 400 Å to 800 Å, the transmittance is reduced by 5%. In comparison, the disclosed technology does not influence the transmittance of the liquid crystal panel.

For another example, the conventional technology may coat a layer of resin of low dielectric constant on the passivation layer, to reduce the capacitance between the common electrode and the pixel electrode; moreover, to avoid bad IC bonding, the resin layer is generally added only in the pixel region, and the resin layer at other regions on the passivation layer need to be etched, thus this method need one more mask on the original basis, the manufacturing process is complicated, the cost is increased, and due to the application of the resin layer, the driving voltage of the liquid crystal increases accordingly, the energy consumption of the liquid crystal panel increases.

It should be explained finally that the embodiments described above are intended to illustrate but not limit the disclosed technology; although the disclosed technology has been described in detail herein with reference to the forgoing embodiments, it should be understood by those skilled in the art that the technical solutions described in the forgoing embodiments may be modified or some of the technical features can be equivalently substituted without making the nature of the corresponding technical solutions departing from the spirit and scope of the technical solutions of various embodiments of the disclosed technology.

What is claimed is:

1. An array substrate, comprising: a base substrate, comprising a pixel region and a peripheral region; data lines and gate lines formed to transversely and longitudinally cross each other on the base substrate to form a plurality of pixel units in the pixel region, wherein each of the pixel units comprises a switching element, a pixel electrode and a common electrode above the pixel electrode, and the common electrode has slits in each pixel unit and is a plate-shaped electrode in the pixel region, and when powered on, the common electrode forms a horizontal electric field together with the pixel electrode of each pixel unit; and a common electrode line formed in the pixel region and connected with the common electrode, wherein the common electrode line comprises a first common electrode line and a second common electrode line, the first common electrode line is disposed at the same layer as the data lines and parallel with the data lines, the second common electrode line is disposed at the same layer to the gate lines and parallel with the gate lines, and the first common electrode line and the second common electrode line are respectively connected with the common electrode through contact via holes.

2. The array substrate according to claim 1, wherein the material of the common electrode line comprises a metal or a metal oxide.

3. The array substrate according to claim 1, comprising a plurality of common electrode lines, and wherein the number of the rows or columns of the pixel electrode is a multiple of the number of the common electrode lines, and the common electrode lines are uniformly and spacedly distributed in the pixel region.

4. A liquid crystal display, comprising:

a liquid crystal panel, wherein the liquid crystal panel comprises a color film substrate and the array substrate according to claim 1 facing with each other, and a liquid crystal layer is interposed between the color film substrate and the array substrate.

* * * * *